United States Patent [19]
MacMaster et al.

[11] 4,282,491
[45] Aug. 4, 1981

[54] AMPLIFIER WITH SEVERED TRANSMISSION LINES

[75] Inventors: George H. MacMaster, Lexington; Lawrence J. Nichols, Burlington, both of Mass.

[73] Assignee: Raytheon Company, Lexington, Mass.

[21] Appl. No.: 103,312

[22] Filed: Dec. 13, 1979

[51] Int. Cl.³ .............................................. H03F 3/60
[52] U.S. Cl. .................................... 330/286; 330/56; 330/289; 333/137
[58] Field of Search ............... 330/56, 61 A, 286, 287, 330/289; 333/100, 137

[56] References Cited

U.S. PATENT DOCUMENTS 3,761,834  9/1973  Dudley et al. ................... 330/56 X
4,189,683  2/1980  Fassett et al. ..................... 330/287

*Primary Examiner*—James B. Mullins
*Attorney, Agent, or Firm*—Philip J. McFarland; Joseph D. Pannone

[57] ABSTRACT

A multiple channel amplifier providing both gain and-/or phase shift to a microwave signal is formed of a set of transmission lines connected in parallel by means of a power splitter at the input end and a power combiner at the output end of the set of transmission lines. The transmission lines are disposed in a cylindrical array of electrically conducting bars which support amplifying and-/or phase shifting elements between the bars and withdraw heat from the amplifying and/or phase shifting elements. The transmission lines may be slotted or severed for directing power flow towards an output terminal of the amplifier. The amplifying and/or phase shifting elements are conveniently mounted on a set of heat sinks to form modules, each of which is readily inserted and detached from the cylindrical array. An enlarged region between adjacent bars serves as the site of a module, the opposed surfaces of the bars and of the heat sink providing the function of a transmission line to conduct power along opposite sides of the module resulting in a push-pull amplifier configuration. Impedance matching is provided by transitions in the bar spacing. The splitter and the combiner may include spider-like structures for coupling the bars to a coaxial line, or a crossed-slot aperture and wedge for coupling the bars to a waveguide.

11 Claims, 36 Drawing Figures

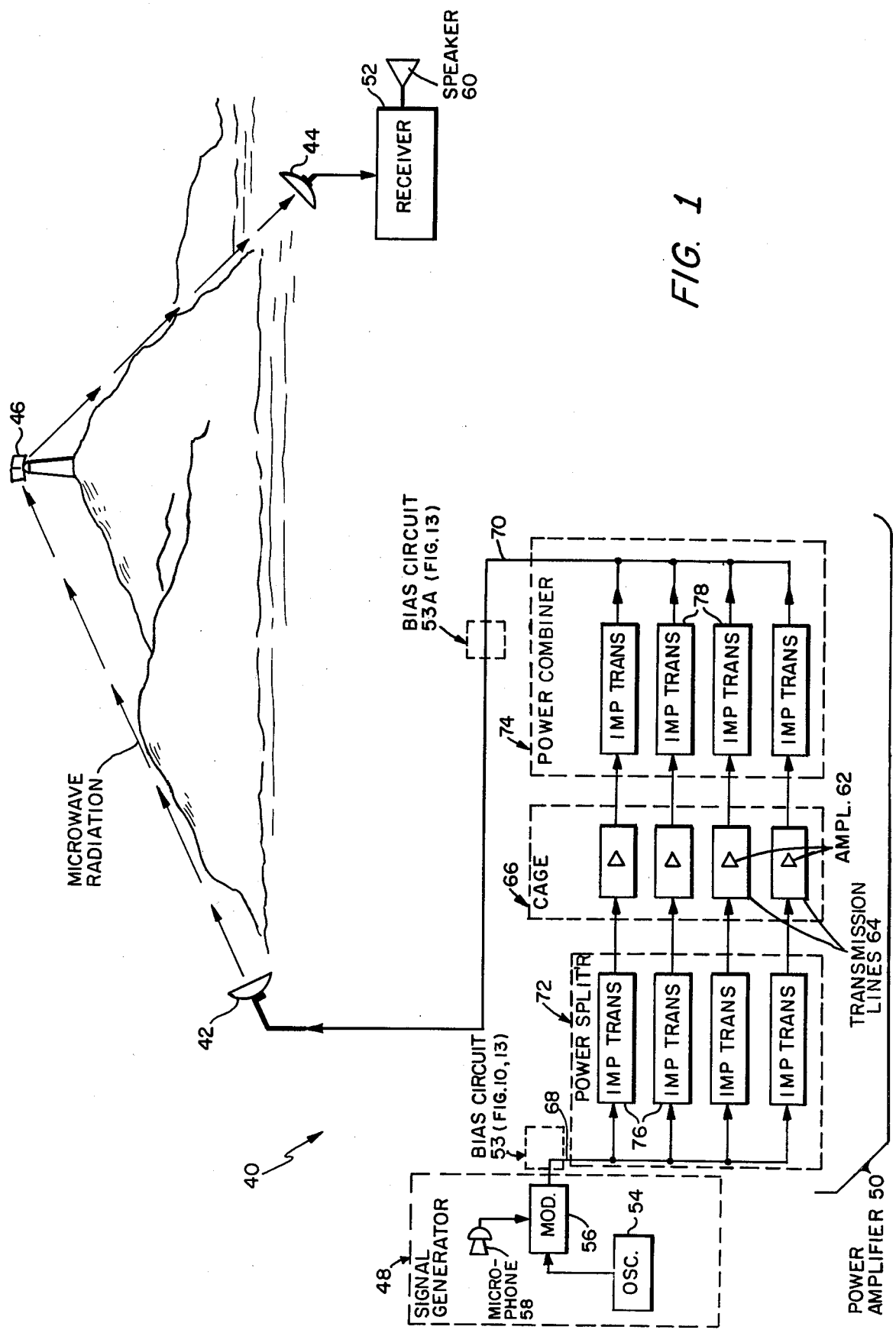

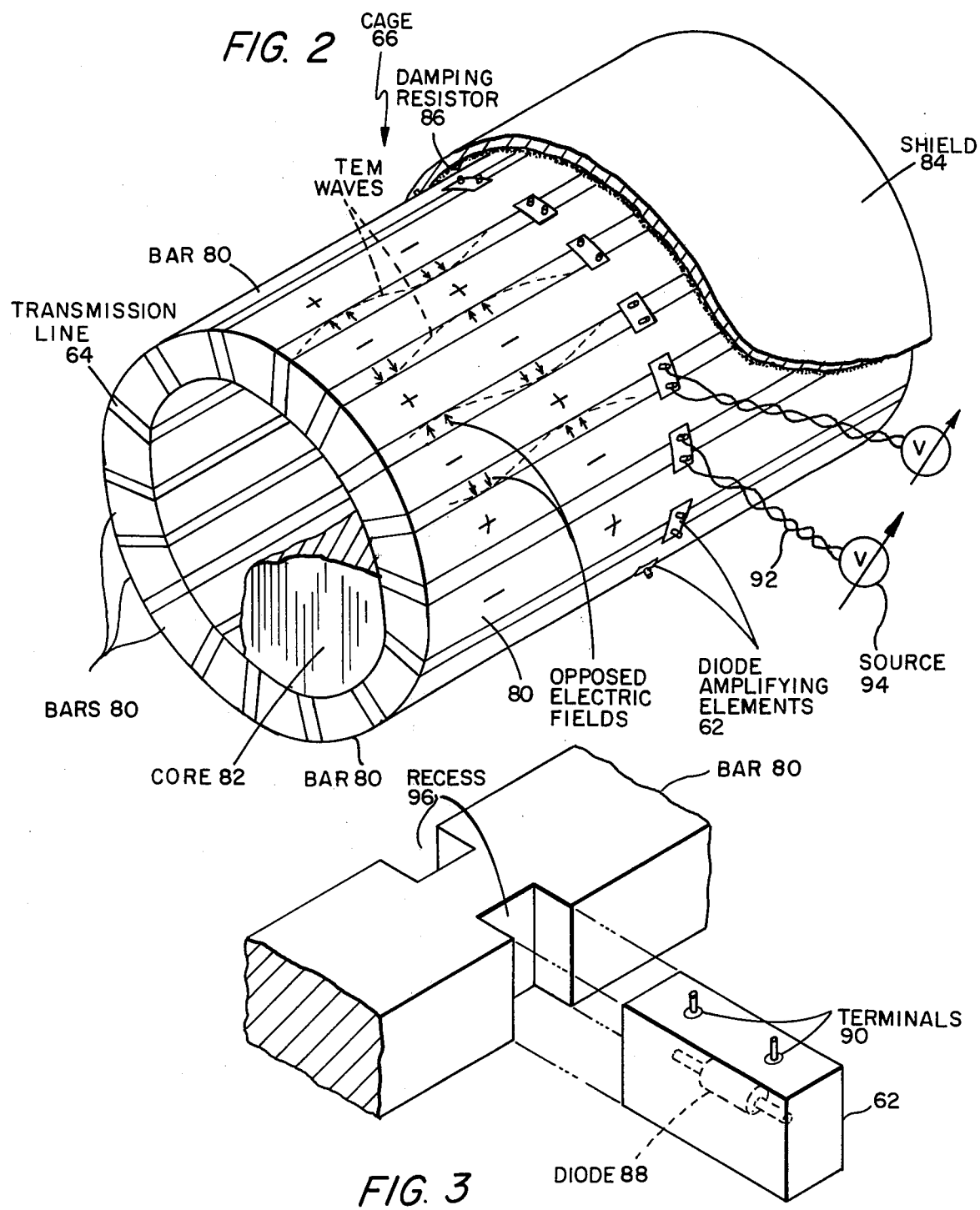

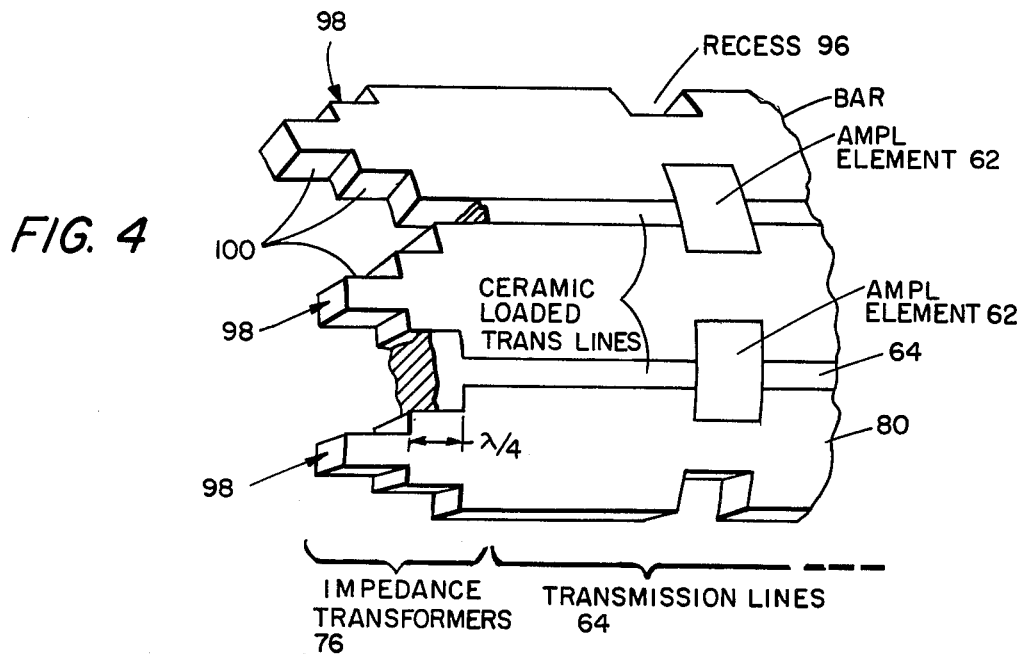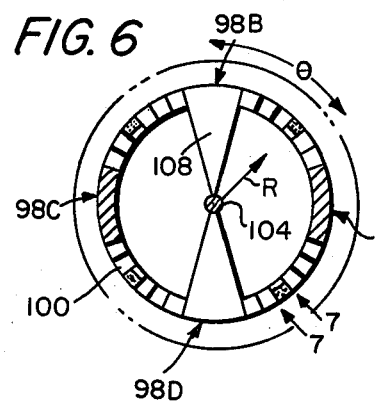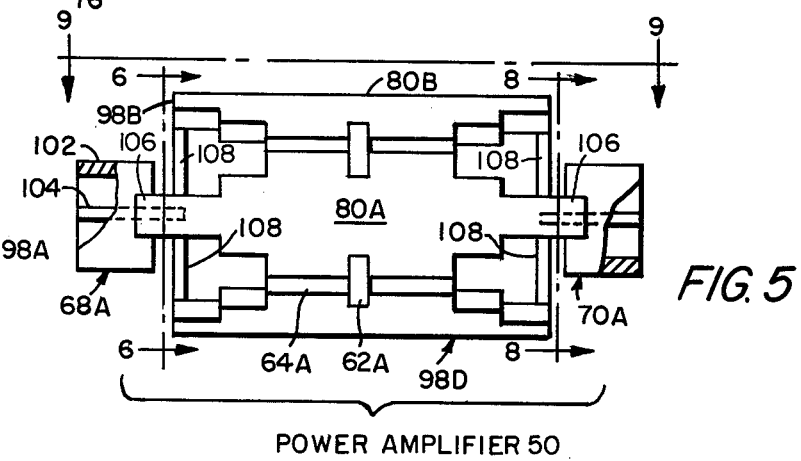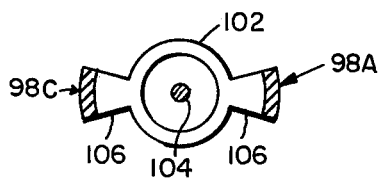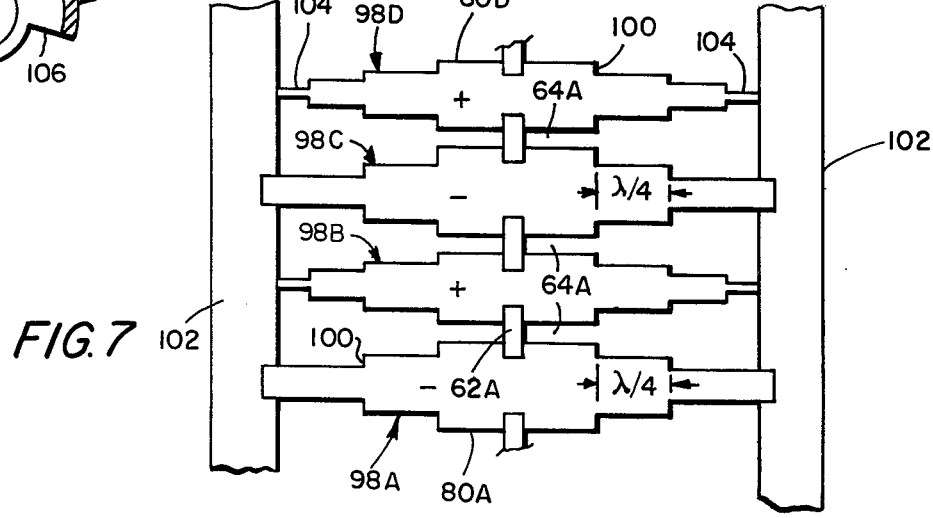

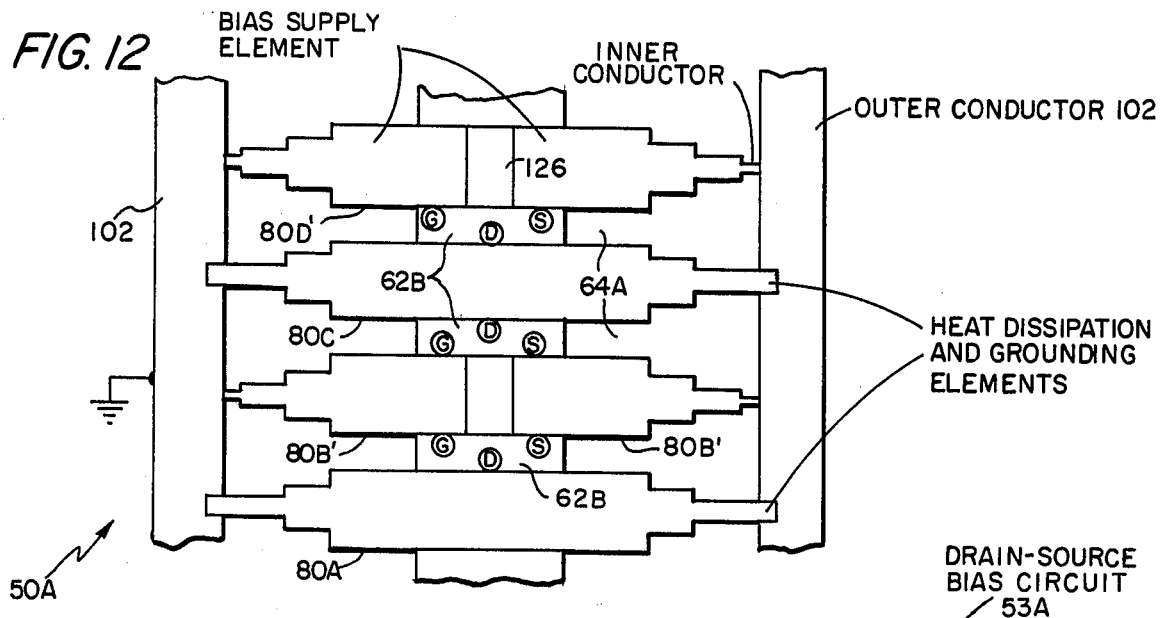
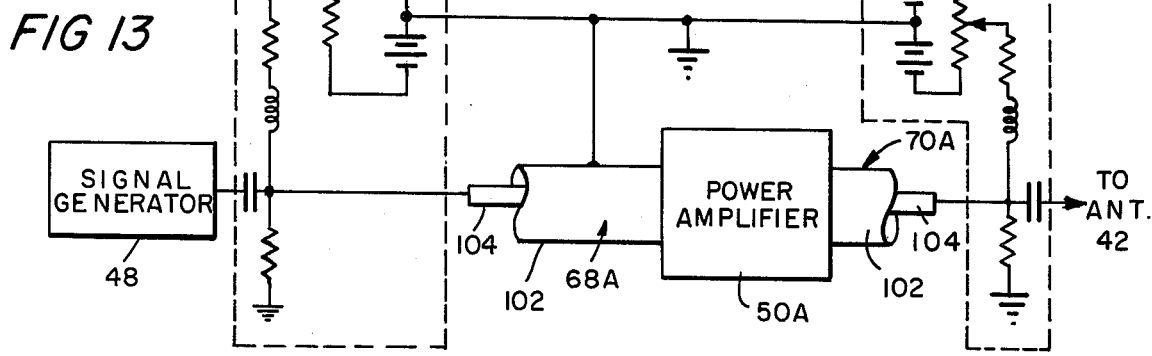
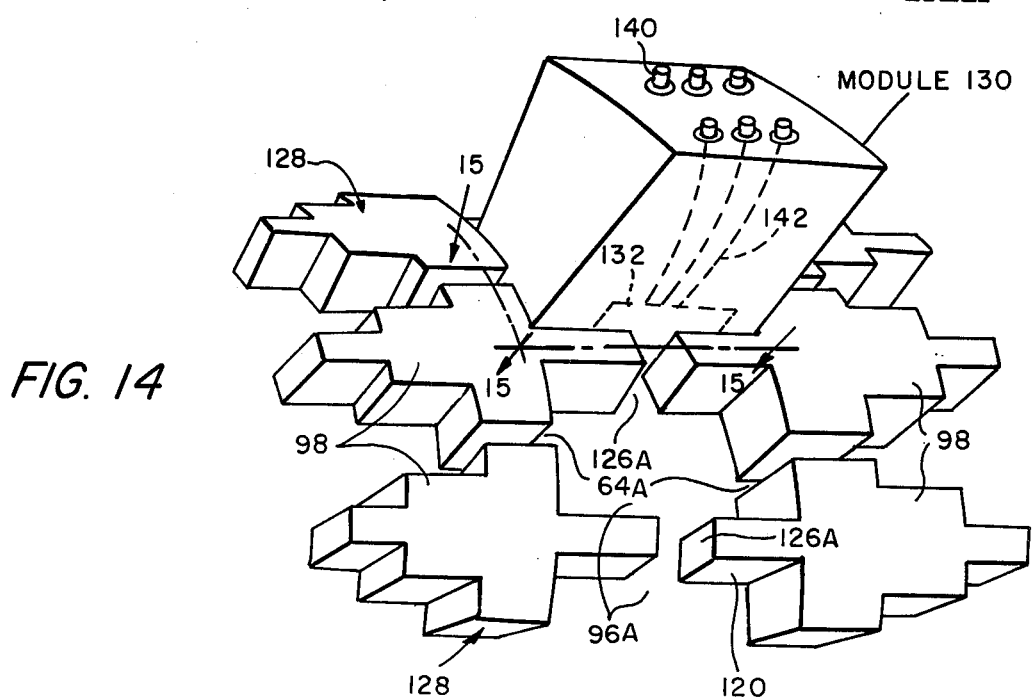

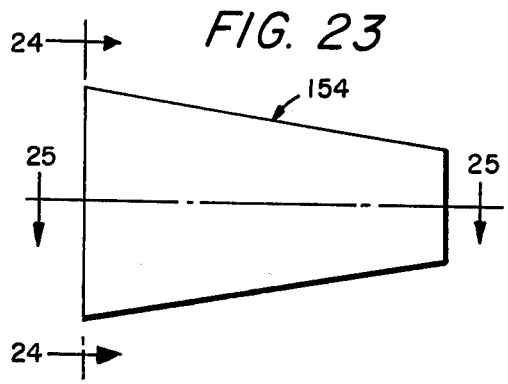
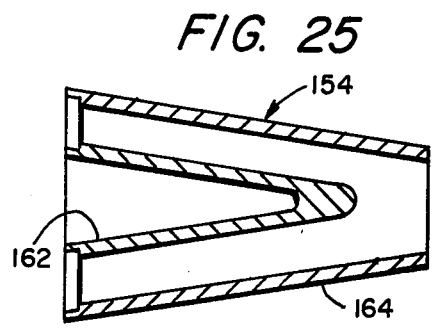
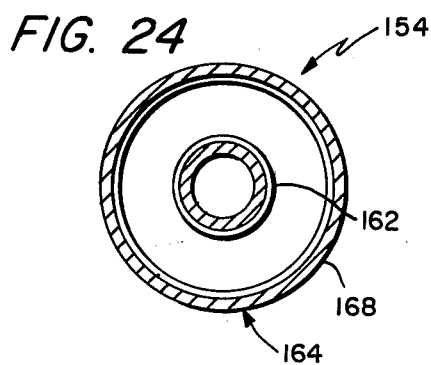
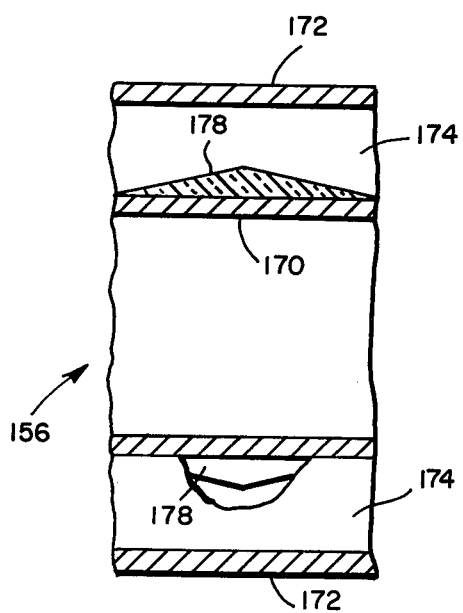
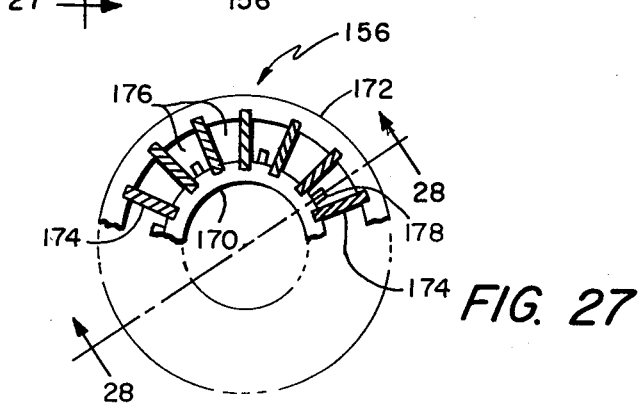

AMPLIFIER WITH SEVERED TRANSMISSION LINES

The invention herein described was made in the course of, or under a contract or subcontract thereunder, with the Department of Defense.

BACKGROUND OF THE INVENTION

Energy in the microwave portion of the electromagnetic spectrum is often utilized in communication systems for transmitting data from one location to another. While powerful amplifying devices such as traveling wave tubes have been utilized in the past for providing sufficient intensity for transmitting the microwave radiation, the advent of solid state amplifying devices, operable at microwave frequencies, provides an alternative form of amplifying element which is less costly, operates on lower voltages negating the need for high-voltage power supplies, and provides relatively noise-free amplification over an adequately wide bandwidth for use in the communication system.

A problem arises in that the power of present day solid state devices is much lower than that of the aforementioned traveling wave tube and other such amplifying devices, the lower power precluding the use of a single solid state amplifying device in a practical communication system. Amplifiers which combine several solid state amplifying devices in a single circuit to share the power have had physical structures and circuit configurations which limit the bandwidth from that which the solid state devices can supply, and which limit the power dissipation so that over heating may occur if the amplifying devices are utilized at their maximum power levels.

SUMMARY OF THE INVENTION

The aforementioned problem is overcome and other advantages are provided by a microwave structure which, in accordance with the invention, accommodates a larger amount of power by distributing the power among a plurality of solid state devices, or semiconductors, such as transistors and diodes which serve as amplifying or phase shifting elements. The structure has multiple parallel branches which support the respective semiconductors for processing respective portions of an input signal, the branches being substantially isolated electrically from each other to insure stability of operation. The branches are formed by a set of bars, in the form of a cage, wherein the bars are preferably positioned along a cylindrical surface and parallel to a common axis. The processing involves an amplification, modulation, and/or phase shifting of the input signal. The microwave structure forms a part of a microwave system incorporating a power splitter and a power combiner. The power splitter has an input port and is connected to one end of the microwave structure for combining the signal powers in each of the branches to produce an output signal. The power splitter and power combiner are each formed of a stepped impedance transformer or tapered waveguide for increased bandwidth.

The bars are formed of an electrically and thermally conductive material such as copper. The bars are spaced apart and have opposed parallel surfaces which define individual transmission lines supporting transverse electromagnetic (TEM) waves wherein the electric fields are concentrated and made substantially parallel. Individual ones of the bars 30 have sufficiently wide cross sections relative to their lengths to serve as a conductor of heat for the extraction of heat developed during the aforementioned signal processing. Individual ones of the bars are recessed or slotted to accomodate the semiconductor amplifying elements or phase shifting elements which are positioned within the paths of the electromagnetic waves to accomplish the signal processing. The electric fields of the TEM waves in adjacent waveguides are directed in opposite directions to inhibit radiation of electromagnetic energy both inwardly and outwardly from the cylindrical array of the bars as is taught with reference to a cylindrical array of wire transmission lines in the U.S. Pat. No. 3,761,834 which issued on Sept. 25, 1973 in the names of Kenneth W. Dudley, George H. MacMaster and Lawrence J. Nichols. The opposed directions of the electric fields are provided by the power splitter in a manner to be described. The foregoing constraining of the propagation of the waves with the transmission lines isolates the signal processing in one branch from the signal proprocessing in other branches, thereby preventing oscillation and insuring stable operation. To accomplish still further isolation, as may become more desirable as the gain of the amplifying elements is increased, a resistive shell and outer electrostatic shield, as well as a central slug of resistive material, may be employed to further attenuate any coupling of electromagnetic energy between the transmission lines as is disclosed in the aforementioned Dudley patent.

For ease in describing the invention, the use of the term, amplifying element, hereinafter will be understood to include complex amplification, namely, the imparting of gain and/or phase shift to the input signal. Furthermore, since the gain and/or phase imparted by transistors and diodes is often adjustable by means of electrical bias circuits to admit a modulation of the input signal, it is to be understood that the use of the term amplifying element hereinafter also includes the modulation function.

The amplifying element, which may be a transistor or diode circuit, has a characteristic impedance. The spacing between the bars is preset to match the impedance of the transmission line to the characteristic impedance of the amplifying element. The impedances of the input and the output ports are transformed to the impedance of the bar transmission line by the power splitter and the power combiner, respectively, in a manner to be described.

The power splitter and the power combiner as noted hereinabove, may take one of two basic forms for connection with a coaxial line or a waveguide. Considering first the description of the power splitter, in the case wherein the input port is a coaxial line, alternate ones of the bars are coupled to the outer conductor of the coaxial line while the remaining bars are coupled to the inner conductor of the coaxial line. The alternating coupling of the bars to the inner and the outer conductors provides for the periodic reversal of the direction of the electric fields in the electromagnetic waves propagating between the bars.

For coupling the bars to the inner conductor of the coaxial line, the power splitter comprises a set of arms which fan out from a central point and may sometimes be referred to hereinafter as an inner spider. The inner spider connects between the bars and the inner conductor, the central point being connected to the inner conductor while the arms are connected to alternate ones of the bars. The arms may fan out gradually to provide a taper from the inner conductor to the arm or, alternatively, the arms may advance outwardly from the central axis by a series of steps. A relatively large number of steps or continuous taper results in a relatively large bandwidth, while a smaller number of steps results in a smaller bandwidth for electromagnetic signals propagating through the power splitter.

For coupling the bars to the outer conductor of the coaxial line, a correspondingly numbered set of arms, which may be referred to hereinafter as an outer spider, is uniformly positioned about the periphery of the outer conductor. The arms are connected from the outer conductor to alternate ones of the bars. The arms may be tapered or stepped, either to fan in, or to fan out, depending on the relative diameters of the outer conductor and of the cage. A cage of many bars would normally be of much larger diameter than the outer conductor in which case the arms of the outer spider fan out from the periphery of the outer conductor.

In the case wherein the input port is in the form of a rectangular waveguide, the power splitter comprises an array of crossed slots in a side wall of the waveguide, and a transition region between the slotted portion of the waveguide and the cage. The transition region includes a generally conical or hyperboloidal wedge positioned along a central axis of the cage with the apex of the wedge pointing to the crossed-slot array. The outer wall of the transition region has a frustoconical shape, the surfaces of the wall and the wedge tapering towards each other with the minimum spacing occurring adjacent the cage and being equal to the width of a parallel-plate waveguide. As a result of the crossed-slot coupling, the transverse electric field of a wave propagating in the waveguide is converted to an electric field directed circumferentially around the wedge of the transmission region. For coupling the transition region to the transmission lines of the cage, alternate ones of the transmission lines are provided with 180° phase shifters to provide the aforementioned periodic reversal of direction of the electric fields of the TEM waves.

The preceding description of the power splitter also applies to the power combiner and the coupling of its output port to a coaxial line or a waveguide. The power combiner may be provided with either of the foregoing structures utilized in building the power splitter, since the foregoing structures are reciprocal to the transmission of electromagnetic energy.

A feature of the invention is found in the capability of the microwave system, composed of the cage of bars in combination with the power splitter and the power combiner, to accommodate a variety of two- and three-terminaled solid state devices. Energization of the solid state devices is accomplished either by use of individual ones of the bars to provide operating currents and voltages to the solid state devices or, alternatively, by bifurcating the transmission lines around plug-in modules which contain the solid state devices and are inserted in recessed portions of the bars. The modules receive the operating current and voltage from an external source. A further advantage is found in the use of the module by placing amplifying elements on opposite sides thereof in a push-pull circuit configuration, this configuration providing greater isolation between the branches. In the case wherein the amplifying element is formed of a three-terminated device such as field effect transistor (FET), isolation of the input and the output circuits thereof is readily accomplished by serving a bar between the input and the output terminals, namely, the drain and the source terminals in the case of the FET.

BRIEF DESCRIPTION OF THE DRAWINGS

The aforementioned aspects and other features of the invention are explained in the following description taken in connection with the accompanying drawings wherein:

FIG. 1 is a diagrammatic view of a communication system incorporating a power amplifier constructed in accordance with the invention;

FIG. 2 is an isometric view of a set of bars arranged in the form of a circular cage for defining parallel-plate transmission lines for guiding waves to amplifying elements in the power amplifier of FIG. 1;

FIG. 3 shows an enlarged view of a central portion of a bar of FIG. 2, the view being exploded to show the insertion of a diode into a recess of the bar;

FIG. 4 is a partial view of the assembly of bars of FIG. 2, FIG. 4 showing also stepped transition portions appended to the ends of the bars for serving as impedance transitions;

FIG. 5 is an elevation view of the power amplifier of FIG. 1 having four bars with impedance transition regions appended at the ends thereof;

FIG. 6 is a cross-sectional view of the amplifier of FIG. 5 taken along the line 6—6 of FIG. 5;

FIG. 7 is an unfolded view of the amplifier of FIG. 5 taken along the line 7—7 in the cross-sectional view of FIG. 6;

FIG. 8 is a sectional view of the amplifier of FIG. 5 taken along the line 8—8 of FIG. 5;

FIG. 12 is a view, similar to that of FIG. 7, of an alternative embodiment of the amplifier of FIG. 7 wherein alternate ones of the bars are slotted to provide for the excitation of a semiconductor circuit, such as a field effect transistor, having three terminals;

FIG. 13 is a schematic diagram of a circuit, analogous to that of FIG. 10, for energizing the semiconductor circuits of an amplifier constructed in accordance with FIG. 12;

FIG. 14 shows an alternative embodiment of the structure of FIG. 4 wherein the recessed regions are enlarged to accept a removable module containing a pair of semiconductor circuits;

FIG. 23 shows an elevation view of the conical waveguide of FIG. 22;

FIG. 24 shows an end view of the conical waveguide taken along the line 24—24 of FIG. 23, mating flanges thereof being sectioned;

FIG. 25 shows a sectional view of the conical waveguide taken along the line 25—25 of FIG. 23;

FIG. 26 shows an elevation view of the phase shift assembly of FIG. 22;

FIG. 27 shows an end view of the phase shift assembly taken along the line 27—27 of FIG. 26, vanes of the phase shift assembly being shown in section as they continue into a transition section of FIG. 22;

FIG. 28 shows a sectional view of the phase shift assembly taken along the line 28—28 of FIG. 27;

DESCRIPTION OF THE PREFERRED EMBODIMENT

Figure 9:
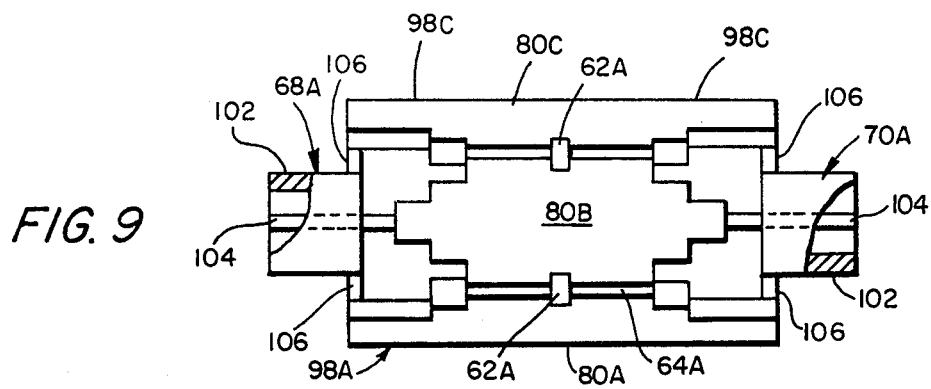
FIG. 9 is a view of the amplifier of FIG. 5 shown rotated 90° about its longitudinal axis, the view of FIG. 9 being taken along the line 9—9 of FIG. 5.

Referring now to FIG. 1, there is seen an exemplary system which utilizes a power amplifier incorporating the microwave structure of the invention. More specifically, FIG. 1 shows a communication system 40 for transmitting a message from one ground station, represented by a transmitting antenna 42, to a second ground station represented by a receiving antenna 44. By way of example, the microwave energy transmitted by the antenna 42 is shown being reflected to the antenna 44 by means of a reflector 46 located on top of a mountain.

The message is generated in a signal generator 48 which is coupled via a power amplifier 50 to the antenna 42, and a receiver 52 which is coupled to the antenna 44. Bias circuits 53–53A may be coupled to the input and output ports of the amplifier 50 for activation thereof as will be described with reference to FIGS. 10 and 13. By way of example, the generator 48 is seen to comprise an oscillator 54 which provides the carrier at the frequency of the microwave radiation, the generator 48 further comprising a modulator 56 coupled between the oscillator 54 and the amplifier 50 for modulating the carrier with the signal of a voice applied to the modulator 56 by a microphone 58. At the receiving station, the voice is heard by a speaker 60 coupled to the receiver 52.

In accordance with the invention, the power amplifier 50 is provided with a plurality of amplifying elements 62 disposed in a set of transmission lines 64 for generating sufficient power to transmit the microwave radiation along the path from the transmitting antenna 42 to the reflector 46, and then along the path from the reflector 46 to the receiving antenna 44. The invention provides for the positioning of the transmission lines 64 within a unitary structure having the form of a cage 66 whereby energy may be coupled thereto via a single input terminal 68 and coupled therefrom by a single output terminal 70. The distribution of power in the signal of the generator 48 among the transmission lines 64 is accomplished by a power splitter 72. The combining of the power from the transmission lines 64 to provide the sum of the powers produced by the amplifying elements 62 at the output terminal 70 is accomplished by a power combiner 74.

As will be described hereinafter, the dimensions of the transmission lines 64 are selected to provide a characteristic impedance which is matched to the impedance of the amplifying elements 62. In the power splitter 72, the impedances of the respective transmission lines 64 are combined to provide a combined value of impedance which is matched to that of the input terminal 68, the combining of the impedances being accomplished by a set of impedance transformers 76 which, as will be described hereinafter with reference to FIGS. 4–21, are formed by stepped and/or tapered transitions in the walls of the transmission lines 64 for the case wherein the input terminal 68 takes the form of a coaxial line. Alternatively, in the case wherein the input terminal 68 takes the form of a rectangular waveguide, the impedance transformers 76 take the form of a wedge in combination with a crossed-slot aperture in the wall of the waveguide of the terminal 68 as will be described hereinafter with reference to FIGS. 22–35. Similar impedance transformers 78 are utilized in the power combiner 74 for combining the impedances of the transmission lines 64 to provide a combined impedance which is matched to that of the output terminal 70.

Referring now to FIG. 2, the cage 66 of FIG. 1 comprises a set of bars 80 which are positioned about a cylindrical surface and are spaced apart with their opposed surfaces serving as the walls of the transmission lines 64 which were referred to earlier in FIG. 1. In the preferred embodiment of the invention, the bars 80 are positioned about a right circular cylinder. By way of example, the transmission lines 64 are provided with a ceramic dielectric material, such as alumina, it being understood that an air dielectric may be utilized in lieu of the ceramic as will be seen in the ensuing figures. Amplifying elements 62, which will be seen in FIG. 3 as exemplary diodes operating in the avalanche mode, are positioned within respective ones of the transmission lines by means of recesses within the bars 80. The bars 80 are fabricated from an electrically and thermally conducting material such as copper. The resulting waves in the transmission lines 64 have the form of TEM waves, the waves being indicated diagrammatically in FIG. 2.

A feature of the invention is the orientation of the electric fields of the waves in opposite directions in adjacent ones of the transmission lines 64 to inhibit radiation from the cage 66 which, in the absence of the opposed field configuration, would act as a radiator of electromagnetic energy. In addition, the microwave energy is inhibited from radiating inwardly into the central portion of the cage 66. Thereby, a signal amplified by one of the elements 62, is not coupled to another of the elements 62. It is noted that with a large number of the bars 80, the distance across a diameter of the cylindrical surface of the cage 66 is much greater than a wavelength of the microwave radiation in vacuum, the diameter being equal to still more wavelengths when the cage is provided with a core 82 of dielectric material.

An electrically conducting shield 84, such as a copper cylinder, may be placed around the cage 66 to further inhibit the radiation of microwave energy from the cage 66. The core 82 may be impregnated with absorptive material such as carbon particles for absorbing microwave energy, and a coating 86 of such material may be applied to the inner surface of the shield 84, for absorbing microwave energy. Thereby, the absorptive material still further attenuates any coupling of radiation from one amplifying element 62 to another of the amplifying elements 62. In an experimental model which was built of only four bars and which utilized amplifying elements 62 having a relatively low gain, on the order of a few dB (decibels) as will be described with reference to FIG. 5, it has been found that satisfactory operation of the invention was obtained without the use of the absorbing material of the core 82 and the coating 86. However, it is suggested that with amplifying elements 62 supplying substantially greater gain than that of the foregoing model, for example 20 dB, the absorptive material would advantageously be employed, particularly, in view of the relatively large difference in magnitudes of electric fields at the input and the output terminals of the amplifying elements 62.

Referring also to FIG. 3, the amplifying element 62 is seen to comprise a diode 88 enclosed within an encapsulating module having terminals 90 shown schematically coupled via wires 92 to a source 94 of bias voltage which sets the operating point of the diodes 88. Also seen in FIG. 3 is a recess 96 within the side of a bar 80 into which an end of the modular amplifying element 62 is secured.

It is noted that the structure of the cage 66 is reciprocal to the propagation of the electromagnetic radiation. Accordingly, in the FIGS. 1 and 2, as well as in the ensuing figures, the input energy will be assumed to be incident upon the cage 66 at the left-hand end thereof, while the output energy will be assumed to exit from the right-hand end of the cage 66.

Referring also to FIG. 4, there is seen a set of the transmission lines 64, formed by a set of the bars 80. The transmission lines 64 are seen to be jointed to the impedance transformers 76 which are formed by transitions 98 appended to the ends of respective ones of the bars 80. The transitions 98 may be tapered or stepped, a stepped embodiment being shown in FIG. 4. A long transition region 98 comprising numerous steps 100, or a gradual taper as will be seen hereinafter, provides a relatively wide bandwidth for signals propagating through the cage 66, while a shorter transition 98 comprising fewer steps 100 results in a narrower bandwidth to signals propagating through the cage 66. To provide the largest bandwidth for a given number of steps, the sizes of the steps 100 have been selected to provide a sequence of impedance increments which vary from step to step in accordance with binomial coefficients, the design of such a sequence of impedances being explained in an article appearing in the journal *Microwaves* on page 48 et seq., published by Hayden Publishing Co. in August 1975. As is well known, the impedance presented by the parallel-bars of the transmission line 64 to a TEM wave having its electric vector directed from one wall to the opposite wall increases with increasing spacing between the walls. Accordingly, the transitions 98 of adjacent ones of the bars 80 produce an increasing spacing between side walls of the transmission lines 64 resulting in an enlarging of the characteristic impedance of the waveguide 64. The transitions 98 in combination with the spacing therebetween which accomplish the foregoing enlarging of the impedance are shown in FIG. 4 as the impedance transformers 76. The microwave design considerations used in the building of the invention as further explained in the book *Microwave Filters, Impedance Matching Networks, and Coupling Structures* by G. Mathaei, L. Young, and E. Jones at pages 267, 281 and 295, published by McGraw Hill Book Company in 1964. It is noted that the cross-sectional area of a bar 80 and the minimum cross-sectional area of a transition 98 are sufficiently large relative to the length of a bar 80 and its transition 98 to enable the bar 80 and its transition 98 to serve as a conductor of heat for withdrawing heat from the amplifying elements 62 contiguous to the bar 80. Thereby, the amplifying elements 62 are maintained at their proper operating temperature since any excess heat developed during the amplifying process is removed by the bars 80.

In constructing the cage 66 of FIG. 2 and the transitions 98 of FIG. 4, it is noted that the lengths of the steps 100, as measured along the axis of the cage 66, are each equal to an odd number of quarter wavelengths at the center frequency of the bandwidth of the radiation to be propagated along the cage 66. In a preferred embodiment of the invention, the steps 100 are provided with a length of one-quarter wavelength. The shield 84 shown covering the cage 66 in FIG. 2 may be extended to cover also the transitions 98 of FIG. 4. The inner surface of the shield 84 and its coating 86 are spaced apart from the outer cylindrical surface of the cage 66 and from the outer surfaces of the transitions 98 so as to permit propagation of the TEM waves along the transmission lines 64 without interference from the shield 84.

Referring now to FIGS. 5-9, there is shown the structural features of the power amplifier 50 which were previously described diagrammatically in FIG. 1. In the building of the power amplifier 50 of FIGS. 5-9, four bars such as the bars 80 of FIG. 2 were utilized, the bars being identified in FIGS. 5-9 by the legends 80A, 80B, 80C and 80D. Transitions, such as the transitions 98 of FIG. 4, are located at both ends of the bars 80A-D, the transitions being correspondingly identified in the FIGS. 5-9 by the legends 98A-D. Transmission lines are formed in the spaces between the bars 80A-D in a manner similar to that disclosed with reference to the transmission lines 64 of FIG. 2; however, the transmission lines of the FIGS. 5-9, which are identified by the legend 64A, utilize an air dielectric instead of the ceramic dielectric of FIG. 2. The steps 100 each have a length of one-quarter wavelength as is indicated in the drawing of FIG. 7. The amplifying elements 62 are positioned within recesses of the bars 80A-D to be oriented across the waveguides as was taught in FIG. 2. However, in lieu of excitation of the diodes of the amplifying elements 62 by means of independently coupled sources 94 of voltage, as was described with reference to FIG. 2, the amplifying elements 62A are to be energized by currents coupled thereto via the bars 80A-D in a manner to be described hereinafter with reference to FIGS. 10-11.

The input and output terminals 68 and 70 of FIG. 1 have been constructed in the form of exemplary coaxial lines 68A and 70A in the embodiment of FIGS. 5-9. Each of the coaxial lines 68A and 70A comprise an outer conductor 102 and an inner conductor 104. The coaxial lines 68A and 70A are shown as having an outer diameter which is less than the diameter of the cage of the bars 80A-D. Accordingly, the ends of the transitions 98A and 98C are connected via posts 106 to the outer conductors 102 for supporting the bars 80A and 80C in their respective positions. The alternate bars 80B and 80D are supported in their respective positions by means of posts 108 connected between the inner conductors 104 and the respective ends of the transitions 98B and 98D. The operation of the posts 106 and 108 is in accordance with the operation of a similar set of posts in the transitions shown in the aforementioned Dudley patent. The transitions 98A-D in combination with their respective posts 106 and 108 provide the functions of the impedance transformers 76 of FIG. 1 to match the impedances of the amplifying elements 62A to the impedance of the coaxial lines 68A and 70A. A TEM wave traveling along the coaxial line 68A has its electric field directed transversely in the radial direction between the inner conductor 104 and the outer conductor 102. In view of the alternating connections of the bars 80A-D to the conductors 102 and 104, the TEM wave produces the alternating arrangement of the electric field in the TE waves between the bars 80A-D as was described previously with reference to FIG. 2. For example, with reference to FIG. 9, it is seen that an electric vector directed from the inner conductor 104 to the outer conductor 102 will, upon propagation along the transmission line 64A, be directed away from the bar 80B towards the bars 80A and 80C.

Figure 9A:
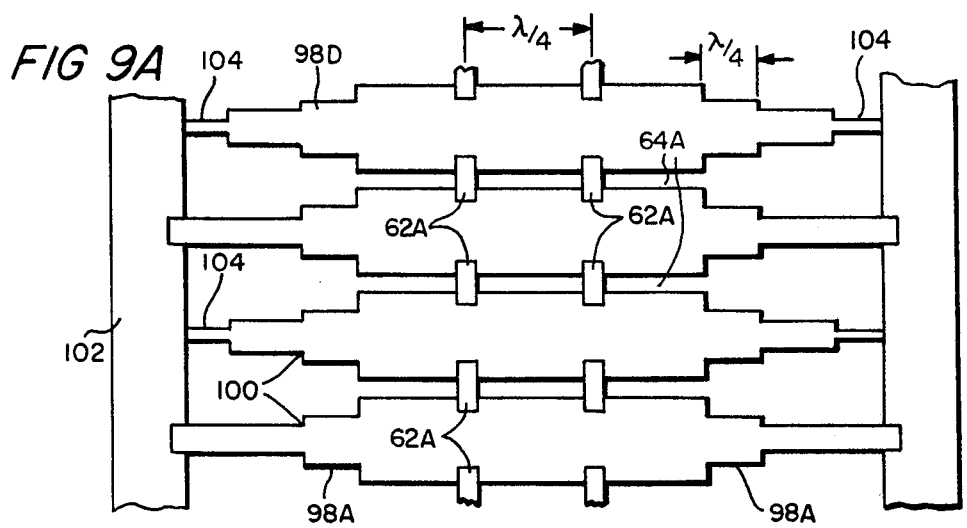
FIG. 9A is a view, similar to that of FIG. 7, of an alternative embodiment of the amplifier of FIGS. 5-9 wherein the bars are provided with an additional set of recesses to accommodate a pair of amplifying elements within each of the transmission lines.

Referring also to FIG. 9A, there is seen an alternative embodiment of the invention which differs from that of FIGS. 5-9 in that, in FIG. 9A, a pair of amplifying elements 62A are located within each of the waveguides 64A as compared to the single elements 62A of FIG. 7. The pair of amplifying elements 62A are spaced apart by a distance of one-quarter wavelength ($\lambda/4$). The embodiment of FIG. 9A provides an advantage over that of FIG. 7 by a more efficient use of the power produced by the amplifying elements 62A. In the embodiment of FIG. 7, the power produced by an amplifying element 62A propagates in two directions, both toward the input terminal and toward the output terminal. The portion of the power propagating towards the input terminal is absorbed within the signal generator 48 and the bias circuit 53, and thus does not appear at the output terminal of the power amplifier of FIG. 7. The quarter wavelength spacing of FIG. 9A provides a phasing between the radiated signals of the two amplifying elements 62A in a transmission line 64A such that the radiated signals add constructively in the forward propagation direction (toward the right), but cancel in the reverse propagation direction (toward the left), so that substantially all of the radiated power is presented to the output terminal of the power amplifier of FIG. 9A. Additional amplifying elements (not shown) may be added at quarter wavelength spacings to more completely direct the radiated power of the amplifying elements toward the output terminal.

Figure 10:
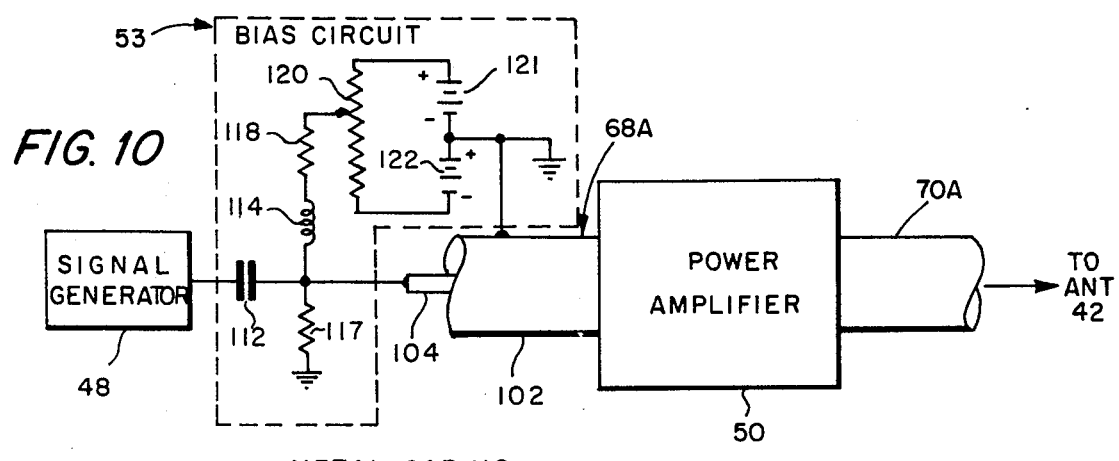
FIG. 10 shows a schematic diagram of a circuit for impressing a voltage between an inner and an outer conductor of a coaxial line coupled to the power amplifier of FIG. 5 whereby the voltage appears between alternate ones of the bars to provide a bias voltage to the amplifying elements of the power amplifier.
Figure 11:
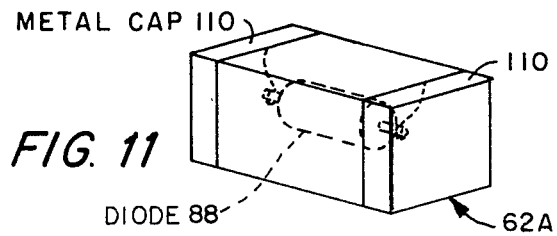
FIG. 11 shows an alternative embodiment of the diode of FIG. 3 wherein the encapsulation includes end caps for contacting alternate ones of the bars of the amplifier of FIG. 5 whereby the voltage is impressed across the terminals of the diode.

Referring also to FIGS. 10 and 11, the amplifying element 62A is seen to comprise a pair of end caps 110 which are coupled to the terminals of the diode 88 in lieu of the terminals 90 of FIG. 3. The end caps 110 are fabricated of an electrically conducting material such as copper and provide for a direct electrical coupling between the terminals of the diode 88 and a pair of the bars such as the bars 80B and 80C. Thereby, upon applying a bias voltage or current via the bias circuit 53 of FIG. 10, the impression of an electric field between the inner conductor 104 and the outer conductor 102 results in a difference of potential appearing between the aforementioned bars 80B and 80C. For example, if the inner conductor 104 is made positive relative to the outer conductor 102, then the bar 80B becomes positive relative to the bar 80A and also relative to the bar 80C. Accordingly, the amplifying element 62A on one side of the bar 80B would be oriented with its anode coupled to the bar 80B and its cathode coupled to the bar 80A, while the amplifying element 62A on the other side of the bar 80B would be oriented with its anode coupled to the bar 80D while its cathode is coupled to the bar 80C. The signal generator 48, previously seen in FIG. 1, is coupled via a capacitor 112 of the bias circuit 53 to the coaxial line 68A, a choke 114 preventing leakage of the microwave energy of the generator 48 to other parts of the bias circuit 53.

The bias circuit 53 further comprises resistors 117-118, a potentiometer 120 and a voltage source represented as a pair of batteries 121-122 which are connected at a common terminal to ground 124 and to the outer conductor 102 of the coaxial line 68A. The batteries 121-122 are connected in series, with the potentiometer 120 being connected across the serial combination of the batteries 121-122. The resistor 118 is connected to the sliding contact of the potentiometer 120 for selecting both a magnitude of voltage and the positive or negative sense of the voltage. The resistor 118 is preferably of a large value as compared to the resistance of the diode 88 of the amplifying element 62A for supplying a substantially constant value of current to the diode 88 as the diode 88 enters the avalanche mode for producing amplification of the microwave signal in the power amplifier 50. The resistor 117 serves to match the impedance of the generator 48 and the bias circuit 53 to that of the coaxial line 68A for a maximum transfer of signal power from the generator 48 to the power amplifier 50.

Referring now to FIG. 12, there is seen an unfolded view of an alternative embodiment of the amplifier of FIG. 7, the alternative embodiment of FIG. 12 being identified by the legend 50A. The amplifier 50A differs from the amplifier 50 of FIG. 7 in that the bars 80B and 80D of FIG. 7 are severed in FIG. 12, the severed bars of FIG. 12 being identified by the legends 80B' and 80D'. The resulting severs, shown as spaces 126 in the bars 80' and 80D', provide breaks in the walls of the transmission lines 64A so that a microwave signal of increased amplitude produced at the output terminal of an amplifying element is propagated to the right towards the output terminal of the amplifier 50A without having any significant propagation towards the left to the input terminal of the amplifier 50A. The amplifier 50A of FIG. 12 demonstrates the use of a three-terminal amplifying element 62B, such as amplifying element being an exemplary FET having the terminals source, drain, and gate identified in the Figure by the legends S, D, and G.

With respect to the withdrawal of heat from the operation of the amplifying element 62B, the terminal of the amplifying element 62B dissipating the most heat, the drain in the case of an FET, is positioned in contact with the bar 80A or 80C to facilitate the withdrawal of the heat. The heat is readily withdrawn via the bars 80A and 80C as they are connected to the outer conductors 102. The three terminals G, D and S include metal contacts for making electrical connection respectively between the left portion of the bar 80B' or 80D', the bar 80A or 80C, and the right portion of the bar 80B' or 80D'. The spaces 126, in addition to the aforementioned splitting of the bars 80B' and 80D' for directing the amplified microwave power, also permit the seperate energization of the two portions of the bars 80B' and 80D' to provide separate bias voltages between the gain and source terminals, and between the drain and source terminals as will be described with reference to FIG. 13.

Referring now to FIG. 13, the signal generator 48 is seen to be coupled via the bias circuit 53 to the amplifier 50A in the manner previously described in FIG. 10 with reference to the amplifier 50. In addition, a second bias circuit 53, is similarly coupled to the coaxial line 70A for providing a difference of potential between the drain and source terminals of the amplifying elements 62B. Since the right and left portions of the amplifier 50A portrayed in FIG. 12 having the same form, the previous description with respect to the bias circuit 53 of FIG. 10 applies also to the bias circuit 53A, the components of which function in a manner analogous to that of the corresponding components of the bias circuit 53.

Figure 15:
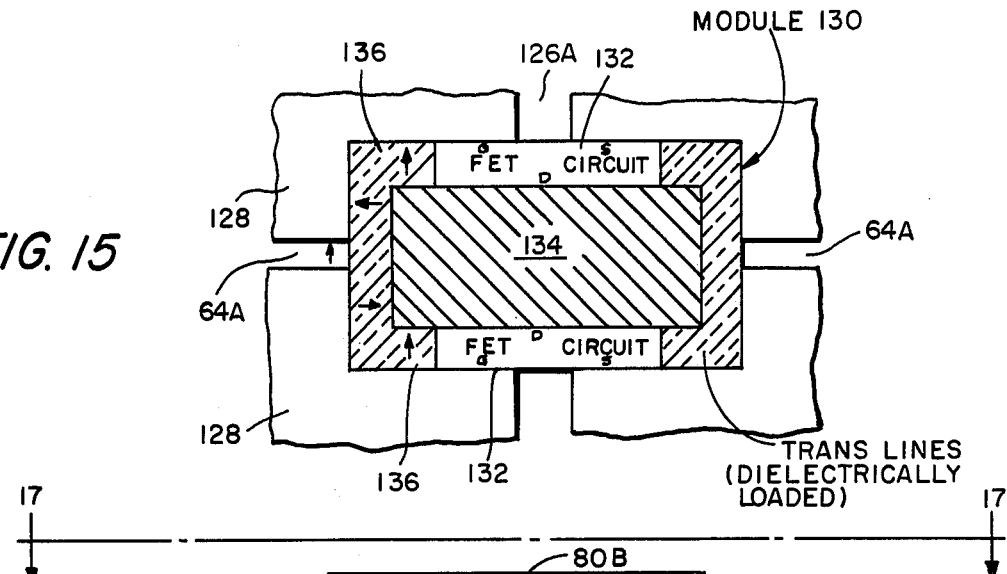
FIG. 15 is a cross-sectional view of the module of FIG. 14 taken along the lines 15—15 of FIG. 14.

Referring now to FIGS. 14–15, there is seen a set of bars 128 which are arranged in the same arrangement as the bars 80 of FIG. 4 but have larger recesses identified by the legend 96A. Each of the bars 128 is terminated by the transitions 98 as is the case with the bars 80 of FIG. 4. The structure of FIGS. 14–15 represents an alternative embodiment for constructing a cage of bars, the structure of FIGS. 14 and 15 differing from that of FIG. 4 in that the recesses 96A permit the deployment of removable modules such as the module 130.

As seen in the cross-sectional view of FIG. 15, the module 130 comprises a pair of semiconductor circuits 132, such as FET circuits, positioned on opposite sides of an electrically and thermally conducting block 134, such as a copper block. The bars 128 are severed to provide spaces 126A for isolating the input and the output terminals of the FET circuits. The sides of the block 134, in cooperation with the sides of the recesses 96A form a bifurcated transmission line wherein a pair of branch transmission lines 136 branch off from the transmission line 64A and couple microwave energy to each of the circuits 132. The transmission lines 136 may be formed of alumina or other dielectric material which is readily formed for the fabrication of the module 130. The spacing between the walls of the transmission line 64A is selected to match the impedance presented by the pair of transmission lines 136 to facilitate the splitting of the microwave power among the two transmission lines 136 and the recombination of the microwave power after amplification by the circuits 132. While the transmission lines 64A having the air dielectric have been shown in FIG. 15, it is understood that the module 130 may be utilized with the transmission line 64 having the ceramic dielectric. External power for exciting the circuits 132 is provided by terminals 140 coupled via leads 142 to the circuits 132 in a manner analogous to that shown previously with reference to the terminals 90 of FIG. 3. It is also noted that all sides of the copper block 134 of a module 130 are at the same potential, with the drain terminals of the two circuits 132 being coupled thereto. Thus, the polarities of the FET's are oppositely directed, as are the electric fields of the TEM waves relative to the block 134, to permit energization of the two circuits 132 of a module 130 in a push-pull configuration permitting increased gain and providing isolation between the signals of the respective modules 130. The block 134 serves as an electrostatic shield between the circuits 132, and also serves as a heat sink for extracting heat dissipated by the circuits 132 during their operation. In view of the protrusion of the module 130 outside the cylindrical surface upon which the bars 128 are mounted, the module 130 is readily cooled by air which may be blown past the module 130 whereby the heat produced by the circuits 132 is dissipated.

Figure 16:
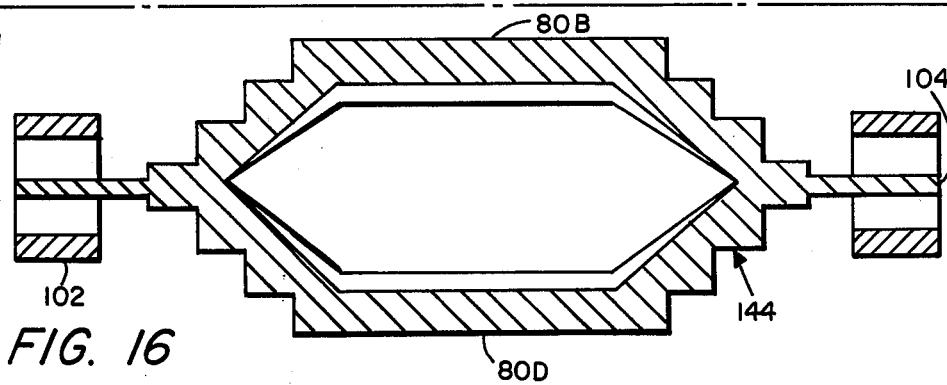
FIG. 16 shows a cross-sectional view of a pair of opposed bars connected to the center conductors of the coaxial lines in an alternative embodiment of the amplifier of FIG. 5, the transition sections of the structure of FIG. 16 being stepped in the radial direction.
Figure 17:
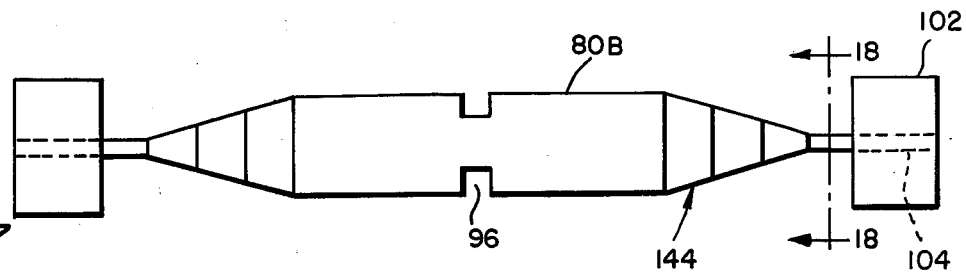
FIG. 17 is a plan view of the structure of FIG. 16 taken along the line 17—17 of FIG. 16.
Figure 18:
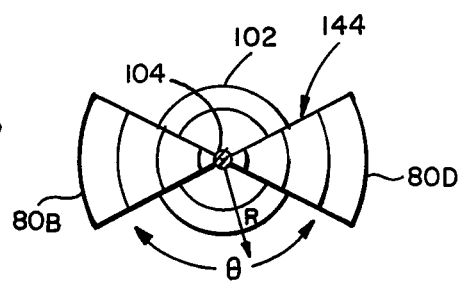
FIG. 18 is a cross-sectional view of the structure of FIG. 16 taken along the line 18—18 of FIG. 17.

Referring now to FIGS. 16–18, there is seen an alternate configuration for the transitions appended to the ends of the bars 80B and 80D of FIG. 5, a transition 144 being utilized in the FIGS. 16–18 in lieu of the transition 98 of FIG. 5 for supporting the bars 80B and 80D upon the inner conductors 104. The transitions 144 are seen to have a different form from the transitions 98 in that the transitions 144 are stepped in the radial direction R and tapered in the circumferential direction, $\theta$, the R and $\theta$ coordinates being seen in both FIGS. 6 and 18. In contrast, the transition 98 is stepped in the circumferential direction and supported by posts 108 in the radial direction. The length of the steps of the transitions 144 are equal to one-quarter wavelength as is the case with the transitions 98.

Figure 19:
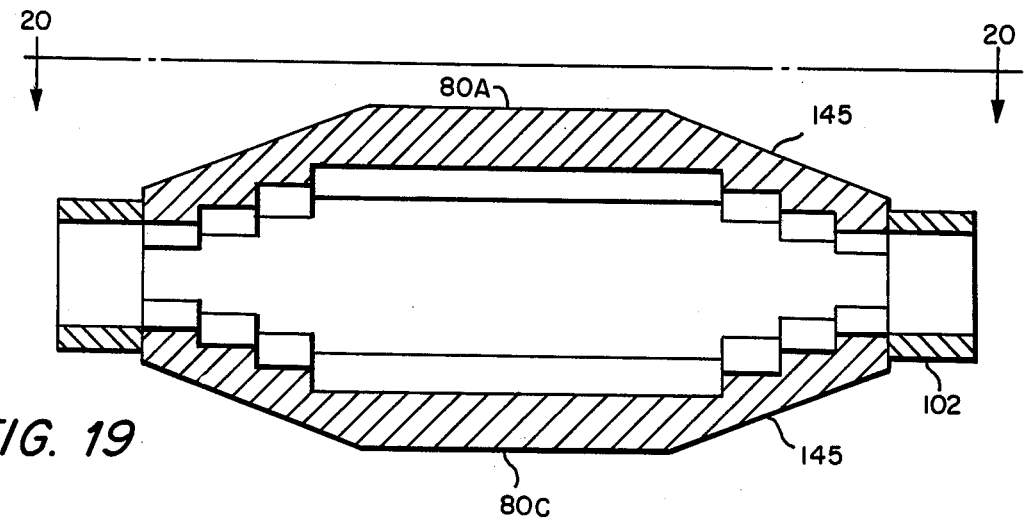
FIG. 19 is a cross-sectional view of a pair of opposed bars for the amplifier of FIG. 16, the bars being coupled to the outer conductor of the coaxial lines of FIG. 9, the bars terminating in transition sections which are stepped in the radial direction.
Figure 20:
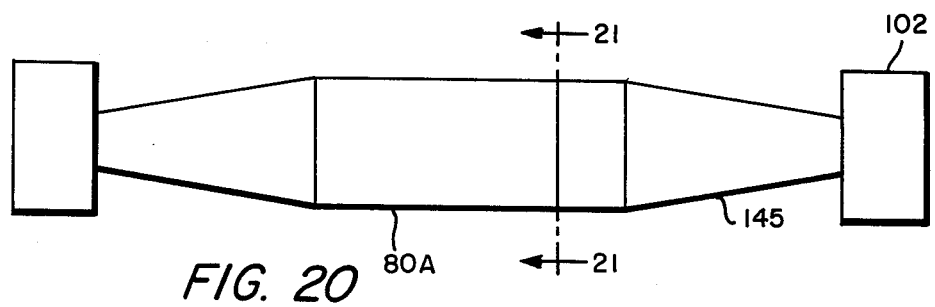
FIG. 20 is a plan view of the structure of FIG. 19 taken along the line 20—20.
Figure 21:
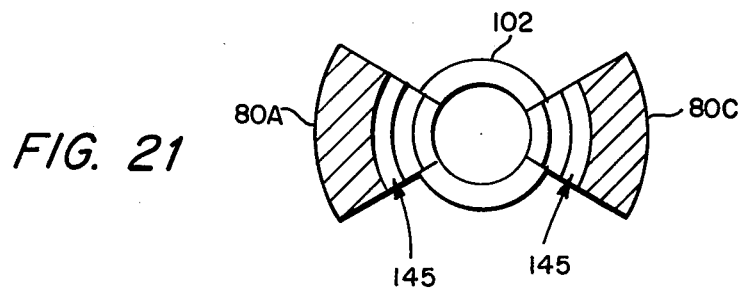
FIG. 21 is a cross-sectional view of the structure of FIG. 19 taken along the lines 21—21 of FIG. 20.

Referring now to FIGS. 19–21, there are seen the bars 80A and 80C of FIG. 9 connected to the outer conductor 102 via an alternative form of transition identified by the legend 145. The transition 145 is utilized in lieu of the transition 98 with its posts 106 of FIG. 9. The transition 145 differs from the transition 98 in that the transition 145 is stepped in the radial direction and tapered in the circumferential direction. Thus it is seen that the transitions 144–145 of FIGS. 16–21 may be utilized for supporting the bars 80A–D, 80B', 80D' and 128 in lieu of the transitions 98 of FIGS. 5–9, 12 and 14. It is also noted that the stepping of the transition 144 need be provided only on the outer surface of the transition 144, while the stepping of the transition 145 need be provided only on the inner surface thereof. The transitions 144–145 are preferred for situations wherein the cage of bars has a diameter much larger than the diameter of the outer conductor 102 since the transitions 144-145 avoid the occurrence of the sudden change in diameter brought on by the use of the posts 106 and 108 and, therefore increase the bandwidth of the amplifier 50 of FIGS. 1 and 5.

Figure 22:
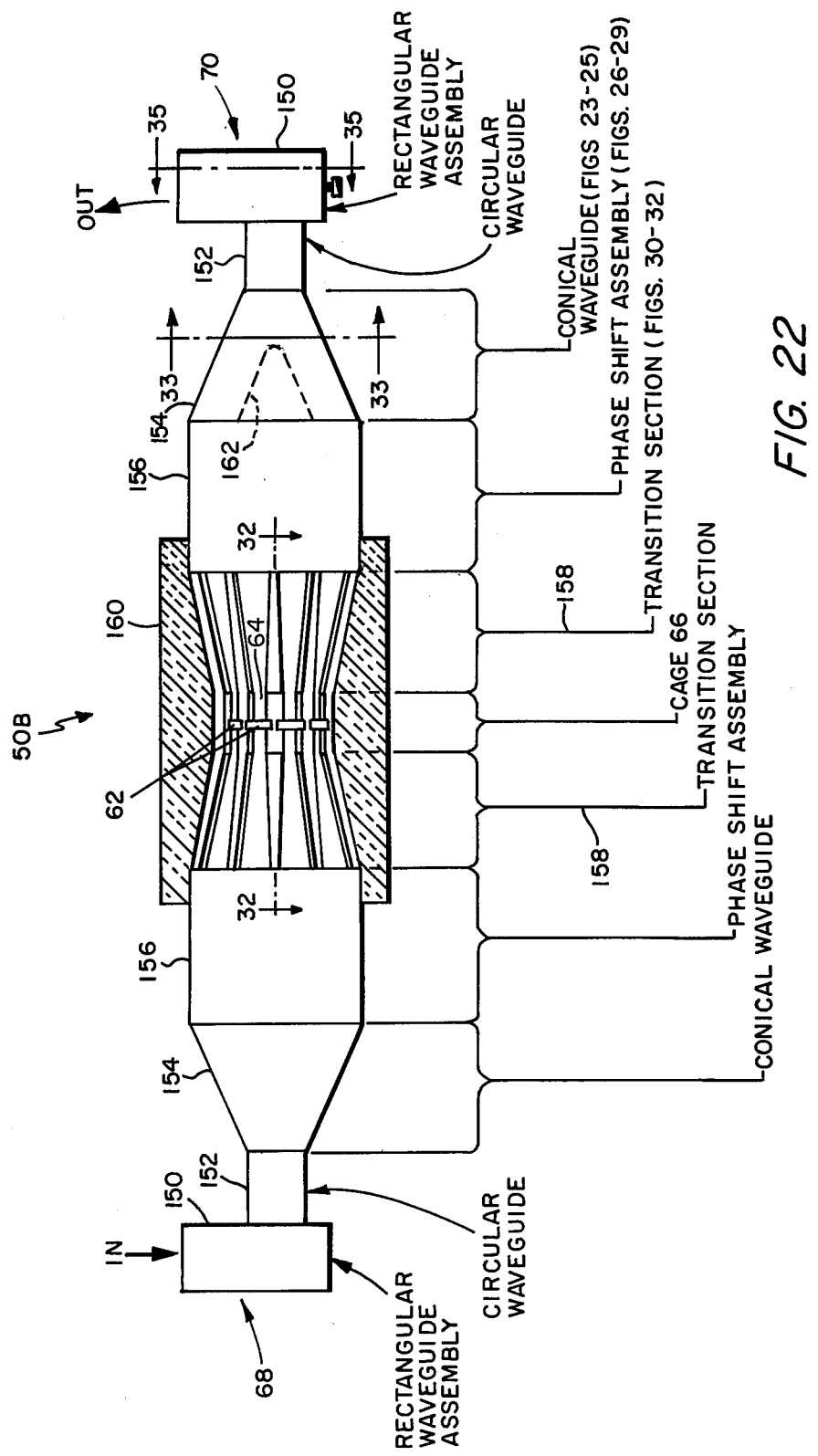
FIG. 22 shows an elevation view of a further embodiment of the power amplifier of FIG. 1 wherein the cage of bars is coupled to rectangular waveguide ports by means of conical waveguides and phase shifter assemblies, a portion of a shield being cut away to expose the cage and vanes connecting from the cage to the phase shifter assemblies.

Referring now to FIG. 22, there is seen an amplifier 50B which is an alternative embodiment of the power amplifier 50 of FIG. 1. The amplifier 50B is preferable to the amplifier 50A of FIGS. 5-9 for the amplification of microwave signals of higher frequency such as X-band and higher. As is known in the design of coaxial cables, the diameter of the inner conductor is reduced at the higher frequencies with the result that the inner conductor can no longer carry high currents without excessive resistive loss. Accordingly, for high power applications, a waveguide is preferred to a coaxial line. The amplifier 50B incorporates the cage 66 of FIG. 1 and has the input terminal 68 and the output terminal 70 fabricated of rectangular waveguide assemblies 150.

The waveguide assemblies 150 are coupled via circular waveguides 152 to conical waveguides 154 which will be described with reference to FIGS. 23-25. The conical waveguides 154 are coupled via phase shift assemblies 156, which will be described with reference to FIGS. 26-29, to transition sections 158 which will be described with reference to FIGS. 30-32 and which, in turn, are coupled to the cage 66. A shield 160 of microwave absorbing material, such as that utilized in the core 82 of FIG. 2, may be provided as shown in FIG. 22, the shield 160 being supported by the assemblies 156 and having an inner surface which is spaced apart from the cage 66 and the transition sections 158. The transition sections 158 are formed of open, parallel-walled, transmission lines similar to that of the cage 66 while closed waveguides, to be described hereinafter, are utilized within the phase shift assemblies 156.

Referring now to FIGS. 23-25, the conical waveguide 154 is seen to comprise a central wedge 162 positioned along the central axis of the outer wall 164 of the waveguide 154. Both the wedge 162 and the wall 164 are formed of an electrically conducting material, such as copper. Both the wedge 162 and the wall 164 are provided with flanges 167-168 for mating with the phase shift assembly 156 as will be described in FIG. 29. The waveguide 154 provides for a distribution of power applied thereto from the waveguide 152 uniformly around the wedge 162 so that a transverse component of the electric field is found to circulate around the wedge 162.

Figure 29:
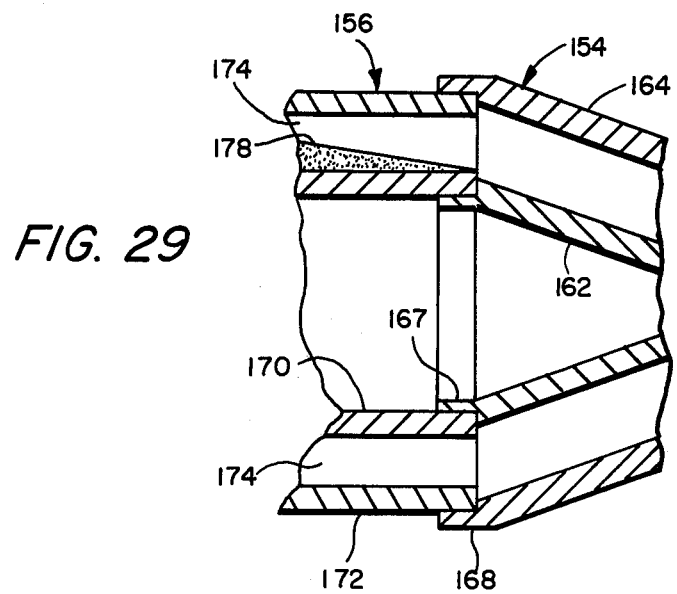
FIG. 29 shows a sectional view of the junction between the phase shift assembly and the conical waveguide of FIG. 22, the phase shift assembly being nested in the flanges of the conical waveguide.

Referring now to FIGS. 26-29, the phase shift assembly 156 is seen to comprise an inner cylindrical wall 170 and an outer cylindrical wall 172 which are fabricated of an electrically conducting material such as copper. The walls 170 and 172 are provided with longitudinal recesses for receiving the edges of vanes 174 which divide the space between the inner and outer walls 170 and 172 into waveguides 176 having a substantially rectangular cross-sectional shape. Alternate ones of the waveguides 176 are provided with phase shifters 178 having the form of wedges of a ceramic material such as alumina, the phase shifters 178 being affixed to the short walls of the waveguides 176 and having a gradual taper for increased bandwidth. The cross-sectional dimensions of the waveguides 176 are sufficiently large so as to insure that the bandwidth of the microwave signal lies well above the cut-off frequency of the waveguides 176. Since the parallel-walled transmission lines 64 or 64A of the cage 66 are not so restricted as to the frequency of propagation of microwave energy, the transmission lines 64 or 64A may be provided with cross-sectional dimensions that are smaller than those of the waveguides 176, such an arrangement being shown in FIG. 22. The phase shifter assembly 156 mates with the conical waveguide 154 as is seen in FIG. 29 wherein the inner conductor 170 is nested within the flange 167 and the outer conductor 172 is nested within the flange 168.

The transverse electric field coupled via the conical waveguide 154 to the phase shift assembly 156 is incident upon each of the waveguides 176 of the phase shifter assembly 156. At the moment of incidence, the electric field has the same sense in each of the waveguides 176. After the microwave energy has propagated through each of the waveguides 176, the waves propagating through the alternate ones of the waveguides 176 containing the phase shifters 178 experience a phase shift of 180° relative to waves propagating in the other waveguides 176 so that, as the waves reach the waveguides of the cage 66 of FIG. 22, the sense of the transverse electric field is reversed periodically from waveguide to waveguide in the manner described previously with reference to FIG. 2.

Figure 30:
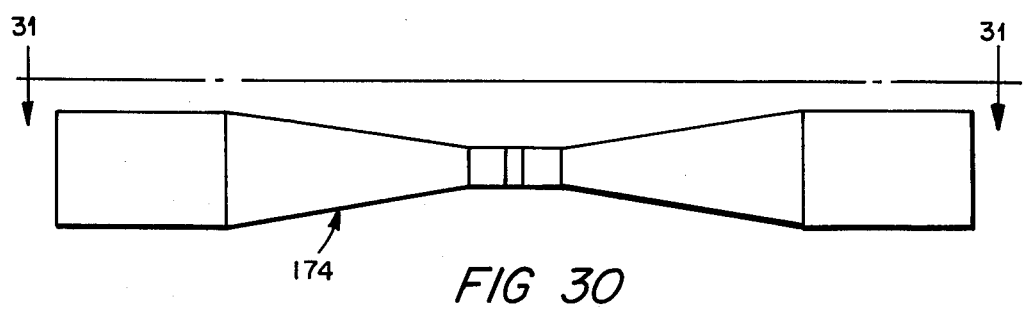
FIG. 30 is an elevation view of a vane passing through both phase shift assemblies, through both transition sections, and through the cage of FIG. 22.
Figure 31:
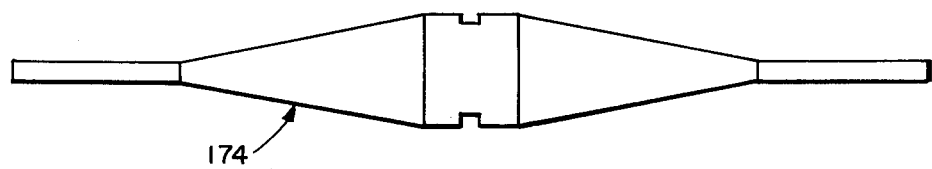
FIG. 31 is a plan view of the vane of FIG. 30 taken along the line 31—31 of FIG. 30.
Figure 32:
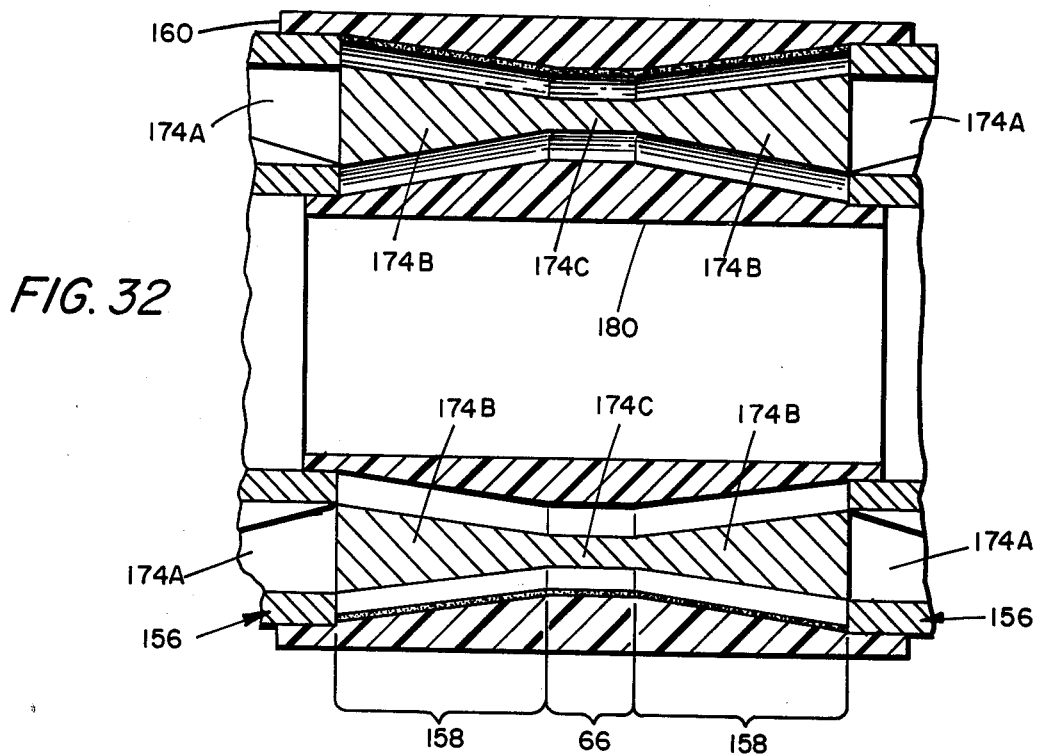
FIG. 32 is a sectional view of the cage and the transition sections abutting the cage taken along the line 32—32 in FIG. 22.

Referring also to FIGS. 30-32, the vanes 174 are seen to extend from one phase shift assembly 156 to the other phase shift assembly 156. The mid portion of a vane 174 is seen to decrease in the R direction at the center portion of the vane 174 and is seen to increase in the θ dimension at the middle of the vane 174. Since the middle portion of a vane 174 serves as a member of a transmission line of the cage 66, as seen in FIGS. 22 and 32, the reduced dimension along the R coordinate and the increased dimension along the θ coordinate provides for a smaller cross-sectional dimension to the waveguides of the cage 66. At the ends of the vanes 174, the enlarged dimension along the R coordinate and the decreased dimension along the θ coordinate provide for the larger cross-sectional dimensions of the waveguides of the phase shift assemblies 156. In addition to the shield 160, shown in FIG. 32 along the outer perimeter of the assembly of the vanes 174, a second shield 180 of the same microwave absorbing material as the shield 160, is advantageously placed along the interior perimeter of the assembly of the vanes 174 for he absorption of any microwave energy which may radiate from the transmission lines formed by the vanes 174. The tapered portions of each vane 174, at the right and left sides of the central portion, provide the transition sections 158 wherein the impedance of the waveguides of the phase shift assemblies 156 is converted to the impedance of the parallel-plate transmission lines of the cage 66. In lieu of the smooth taper of the vane 174 which maximizes the bandwidth of the amplifier 50B, the vanes 174 may comprise a series of steps (as taught with the transition 98) to provide an impedance transition which is of slightly reduced bandwidth but more easily fabricated.

Figures 33, 34, 35:
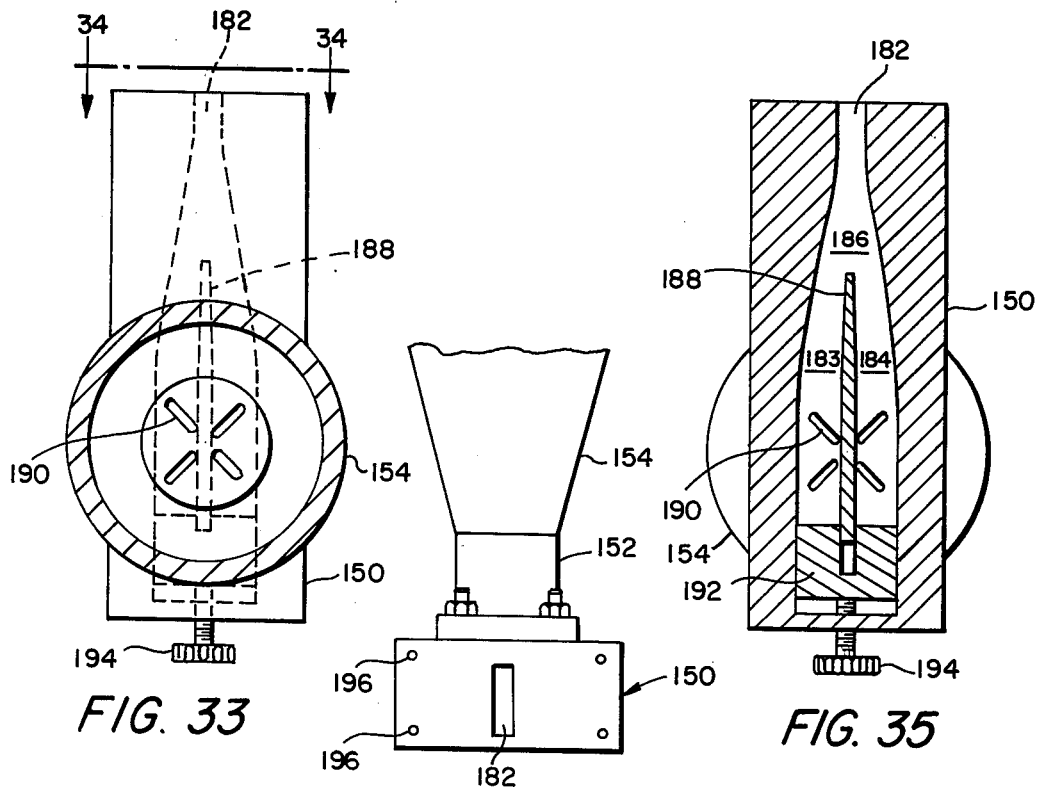
FIG. 33 is a plan view of a rectangular waveguide assembly of FIG. 22 including a portion of the conical waveguide to the right of a wedge thereof taken along the line 33—33 through the right-hand conical waveguide of FIG. 22.
FIG. 34 is an end view of the rectangular waveguide assembly of FIG. 33 taken along the line 34—34 of FIG. 33.
FIG. 35 is a sectional view of the rectangular waveguide assembly of FIGS. 33 and 34 taken along the line 35—35 in FIG. 22.

Referring now to FIGS. 33-35, the waveguide assembly 150 comprises a rectangular waveguide 182 which branches into two waveguides 183 and 184. The branching takes place in a transition region 186 wherein the short wall of the waveguide 182 is enlarged to form the two waveguides 183-184 each of which has cross-sectional dimensions equal to that of the waveguide 182. A vane 188 separates the waveguide 183 from the waveguide 184. A set of four slots 190 are arranged in the configuration of a crossed-slot aperture as viewed along the axis of the circular waveguide 152, two of the slots 190 being located in a short wall of the waveguide 183 while the other two slots 190 are located in a short wall of the waveguide 184. A bifurcated plunger 192 having a first portion in the waveguide 183 and a second portion in the waveguide 184 is positioned by the turning of a knob 194 having a threaded stem for adjusting the physical and electrical lengths of the waveguides 183–184 to tune the waveguide assembly 150 for coupling a maximum power between the waveguide 182 and the circular waveguide 152. A set of four tapped holes 196 are located around the end of the waveguide 182 for securing a further waveguide or probe assembly (not shown) for coupling power, for example, between the power amplifier 50 and the antenna 42 of FIG. 1.

In summary, it is seen that the amplifying elements 62 or circuits 132 may be supported directly by the bars of the transmission lines 64–64A as shown in FIGS. 2, 5, 12 or supported by the modules as shown in FIGS. 14–15, and in either case the transmission lines are coupled to an external circuit by the impedance transformers 76–78 of FIG. 1 which may take either one of the forms shown in FIGS. 4, 5, 16, 19 and 22. The transmission lines are preferably severed as shown in FIGS. 12 and 14 for the use of transistor amplifying elements to insure that the output power is directed toward the output terminal. In the case of diode amplifying elements, the severing of the transmission lines is not required, and adequate directivity for the flow of power can be attained by the use of a series of two, or more, diodes arranged in an array as shown in FIG. 9A. In the case of the modules of FIG. 14, diodes may be utilized in lieu of the transistors in which case the diodes would be encapsulated for support within the module as is done with the transistors, the diodes being oriented transversely of the transmission lines as shown in FIG. 3.

It is understood that the above-described embodiments of the invention are illustrative only and that modification thereof may occur to those skilled in the art. Accordingly, it is desired that this invention is not to be limited to the embodiments disclosed herein but is to be limited only as defined by the appended claims.

What is claimed is:

1. A system for processing radiant energy comprising:
   a set of parallel bars, said bars being spaced apart to provided passages therebetween, said bars being configured to provide a pair of opposed parallel sides to each of said passages to admit the propagation of radiation along said passages;
   means for coupling radiation to said passage, said coupling means being adapted for alternating the sense of a transverse field of said radiation between adjacent ones of said passages; and wherein
   said bars are severed to provide isolation between terminals of an electrical circuit coupled to said bars.

2. A system according to claim 1 wherein said bars are positioned along a cylindrical surface.

3. A system according to claim 2 further comprising a set of said electrical circuits, said circuits being amplifying elements wherein individual ones of said amplifying elements are positioned within said passages by slots in said bars.

4. A system according to claim 3 wherein said amplifying elements have a plurality of terminals for electrically energizing said amplifying elements, said terminals being electrically connected to respective ones of a plurality of said bars, said bars being constructed of electrically conductive material for conducting electric power to said terminals for energizing said amplyfying elements.

5. A system according to claim 1 wherein the sides of a plurality of said bars are slotted for receiving said electrical circuit, said circuit being an amplifying element.

6. A system according to claim 1 wherein said coupling means comprises transition structures coupled to said bars, said transition structures introducing enlargements in the spacing between neighboring ones of said bars.

7. A system according to claim 6 wherein said transition structures include a plurality of steps having a length of an integral number of one-quarter wavelength of the nominal frequency of said radiation.

8. A system according to claim 6 wherein said transition structures are laterally displaced from a terminal for said radiation by arms of a set of radially directed arms.

9. A system according to claim 6 wherein said transition structures include inner and outer conically-shaped waveguide walls and a set of waveguides arranged circumferentially around said inner conical waveguide wall and contacting said outer waveguide wall.

10. A system according to claim 9 further comprising phase shifting elements located in alternate ones of said circumferentially arranged waveguides of said transition structures.

11. A matched channel amplifier structure comprising:
    a set of longitudinal members disposed parallel to a common axis and arranged along a cylindrical surface;
    opposed sides of adjacent ones of said members being parallel and defining a set of parallel-walled transmission lines which admit the propagation of radiation;
    alternate ones of said members being coupled at their respective ends to a heat dissipating element for the dissipation of heat from said members into an external atmosphere;
    means coupled to the termini of respective ones of said transmission lines for combining the power of said radiation in one of said transmission lines with the power of said radiation in a second of said transmission lines; and
    recessed regions in the sidewalls of a plurality of said members communicating with said transmission lines for supporting amplifying elements in respective ones of said waveguides.

* * * * *